United States Patent
Wang et al.

(10) Patent No.: US 10,698,555 B2
(45) Date of Patent: Jun. 30, 2020

(54) ORGANIC LIGHT-EMITTING DIODE (OLED) DISPLAY DEVICE AND PRESSURE TOUCH DRIVING METHOD THEREOF

(71) Applicants: BOE Technology Group Co., Ltd., Beijing (CN); Beijing BOE Optoelectronics Technology Co., Ltd., Beijing (CN)

(72) Inventors: Pengpeng Wang, Beijing (CN); Xue Dong, Beijing (CN); Xiaochuan Chen, Beijing (CN); Haisheng Wang, Beijing (CN); Yingming Liu, Beijing (CN); Xiaoliang Ding, Beijing (CN); Weijie Zhao, Beijing (CN); Shengji Yang, Beijing (CN); Changfeng Li, Beijing (CN); Wei Liu, Beijing (CN); Jian Gao, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 194 days.

(21) Appl. No.: 15/563,426

(22) PCT Filed: Apr. 1, 2017

(86) PCT No.: PCT/CN2017/079291
§ 371 (c)(1),
(2) Date: Sep. 29, 2017

(87) PCT Pub. No.: WO2018/014590
PCT Pub. Date: Jan. 25, 2018

(65) Prior Publication Data
US 2018/0348917 A1    Dec. 6, 2018

(30) Foreign Application Priority Data
Jul. 22, 2016    (CN) .......................... 2016 1 0585740

(51) Int. Cl.
*G06F 3/045*    (2006.01)
*G06F 3/046*    (2006.01)
(Continued)

(52) U.S. Cl.
CPC ............. *G06F 3/046* (2013.01); *G01D 5/145* (2013.01); *G06F 3/0414* (2013.01);
(Continued)

(58) Field of Classification Search
CPC .......... G06F 3/14; G06F 3/046; G06F 3/0414; G06F 3/0416; G06F 2203/04103;
(Continued)

(56) References Cited

U.S. PATENT DOCUMENTS 6,373,986 B1    4/2002    Fink
9,825,179 B2*    11/2017    Yamazaki ........... H01L 29/7869
(Continued)

FOREIGN PATENT DOCUMENTS

CN    1334918 A    2/2002
CN    101243383 A    8/2008
(Continued)

OTHER PUBLICATIONS

Jun. 28, 2017—(WO) International Search Report and Written Opinion Appn PCT/CN2017/079291 with English Tran.
(Continued)

*Primary Examiner* — Vijay Shankar
(74) *Attorney, Agent, or Firm* — Banner & Witcoff, Ltd.

(57) ABSTRACT

An organic light-emitting diode (OLED) display device and a pressure touch driving method, the OLED display device includes: a silicon substrate; a pixel unit and a magneto-dependent sensor disposed on one side of the silicon substrate; and a magnetic field generator configured to provide magnetic fields running through a plane provided with the magneto-dependent sensor to the magneto-dependent sen- (Continued)

sor; the magneto-dependent sensor is configured to detect magnetic variation and convert the magnetic variation into a voltage difference for output.

19 Claims, 5 Drawing Sheets

(51) Int. Cl.
| | |
|---|---|
| G06F 3/041 | (2006.01) |
| H01L 27/32 | (2006.01) |
| G01D 5/14 | (2006.01) |
| G09G 3/3225 | (2016.01) |
| G06F 3/14 | (2006.01) |
| G09G 3/3266 | (2016.01) |

(52) U.S. Cl.
CPC .............. *G06F 3/0416* (2013.01); *G06F 3/14* (2013.01); *G09G 3/3225* (2013.01); *H01L 27/323* (2013.01); *G06F 2203/04103* (2013.01); *G06F 2203/04105* (2013.01); *G09G 3/3266* (2013.01); *G09G 2300/023* (2013.01); *G09G 2300/0408* (2013.01); *G09G 2310/0267* (2013.01); *G09G 2310/067* (2013.01); *G09G 2354/00* (2013.01)

(58) Field of Classification Search
CPC ........ G06F 2203/04105; G09G 3/3266; G09G 3/3225; G09G 2354/00; G09G 2300/023; G09G 2300/0408; G09G 2310/0267; G09G 2310/067
See application file for complete search history.

(56) References Cited

U.S. PATENT DOCUMENTS

| | | | | |
|---|---|---|---|---|
| 9,986,217 | B2 * | 5/2018 | Ellwood, Jr. | .............. G02F 1/09 |
| 10,191,605 | B2 * | 1/2019 | Wang | ....................... G06F 3/046 |
| 2007/0040810 | A1 | 2/2007 | Dowe et al. | |
| 2008/0314749 | A1 * | 12/2008 | Johnson | .............. B01L 3/50273 |
| | | | | 204/450 |
| 2010/0213932 | A1 | 8/2010 | Utsunomiya | |
| 2011/0109591 | A1 * | 5/2011 | Kurokawa | .......... G02F 1/13338 |
| | | | | 345/175 |
| 2012/0032909 | A1 | 2/2012 | Wang | |
| 2013/0154998 | A1 | 6/2013 | Yang et al. | |
| 2013/0193962 | A1 | 8/2013 | Okatake et al. | |
| 2014/0232388 | A1 | 8/2014 | Muraoka et al. | |
| 2017/0003811 | A1 | 1/2017 | Lu | |
| 2017/0184461 | A1 | 6/2017 | Chi et al. | |
| 2017/0234910 | A1 | 8/2017 | Nakamura et al. | |
| 2017/0308221 | A1 | 10/2017 | Li et al. | |
| 2018/0041743 | A1 * | 2/2018 | Ellwood, Jr. | ............. G02F 1/09 |
| 2018/0164920 | A1 | 6/2018 | Wang et al. | |

FOREIGN PATENT DOCUMENTS

| | | |
|---|---|---|
| CN | 101751164 A | 6/2010 |
| CN | 101813757 A | 8/2010 |
| CN | 102340299 A | 2/2012 |
| CN | 103162875 A | 6/2013 |
| CN | 103412654 A | 11/2013 |
| CN | 105630235 A | 6/2016 |
| CN | 105739790 A | 7/2016 |
| CN | 105739806 A | 7/2016 |
| CN | 105867699 A | 8/2016 |
| CN | 106716149 A | 5/2017 |

OTHER PUBLICATIONS

Mar. 11, 2019—(CN) First Office Action Appn 201610585740.5 with English Translation.
Feb. 27, 2020—(EP) Extended European Search Report Appn 17771323.7.
Osberger, et al., "High Resolution Shallow Vertical Hall Sensor Operated with Four-Phase Bi-Current Spining Cerrent", Sensors and Actuators A: Physical, Apr. 13, 2016, pp. 270-276.

* cited by examiner

ORGANIC LIGHT-EMITTING DIODE (OLED) DISPLAY DEVICE AND PRESSURE TOUCH DRIVING METHOD THEREOF

The application is a U.S. National Phase Entry of International Application No. PCT/CN2017/079291 filed on Apr. 1, 2017, designating the United States of America and claiming priority to Chinese Patent Application No. 201610585740.5, filed Jul. 22, 2016. The present application claims priority to and the benefit of the above-identified applications and the above-identified applications are incorporated by reference herein in their entirety.

TECHNICAL FIELD

Embodiments of the present disclosure relate to an organic light-emitting diode (OLED) display device and a pressure touch driving method thereof.

BACKGROUND

It is the industry's research hotspot and the focus of market development to realize a pressure touch function in a display device to implement more diverse touch operations. In order to achieve the pressure touch function, pressure sensors are integrated into the display device. Mostly current kinds of pressure sensors of an electromagnetic induction type possess a module laminated structure and function by the means of receiving induction through a rectangular coil. However, the rectangular coil can only be configured to receive strong signals emitted by magnetic pens or can only barely sense weak signals of finger touch and cannot perform pressure level distinction with respect to finger pressure.

SUMMARY

In view of the above problem, embodiments of the present disclosure provide an OLED display device and a pressure touch driving method, which achieve better pressure touch performance in the OLED display device.

An embodiment of the present disclosure provides an organic light-emitting diode (OLED) display device, comprising: a silicon substrate; a pixel unit and a magneto-dependent sensor which are on one side of the silicon substrate; and a magnetic field generator configured to provide magnetic fields running through a plane provided with the magneto-dependent sensor to the magneto-dependent sensor; the magneto-dependent sensor is configured to detect magnetic variation and convert the magnetic variation into a voltage difference for output.

An embodiment of the present disclosure provides a pressure touch driving method, comprising: providing magnetic fields running through the plane provided with the magneto-dependent sensor to the magneto-dependent sensor; detecting the magnetic variation through the magneto-dependent sensor; converting the magnetic variation into a voltage and outputting the voltage; and identifying a touch position and a pressure value.

An embodiment of the present disclosure provides a signal detection circuit for a detected circuit, the detected circuit includes a first pair of terminals and a second pair of terminals; the first pair of terminals and the second pair of terminals are electrically symmetrical to each other; and the signal detection circuit comprises: a detection voltage input sub-circuit and an induction signal output sub-circuit, in which the detection voltage input sub-circuit is connected to the first pair of terminals and the second pair of terminals; and the induction signal output sub-circuit includes a first output terminal and a second output terminal which are connected to the first pair of terminals and the second pair of terminals and configured to respectively output a first detection voltage and a second detection voltage in different periods.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
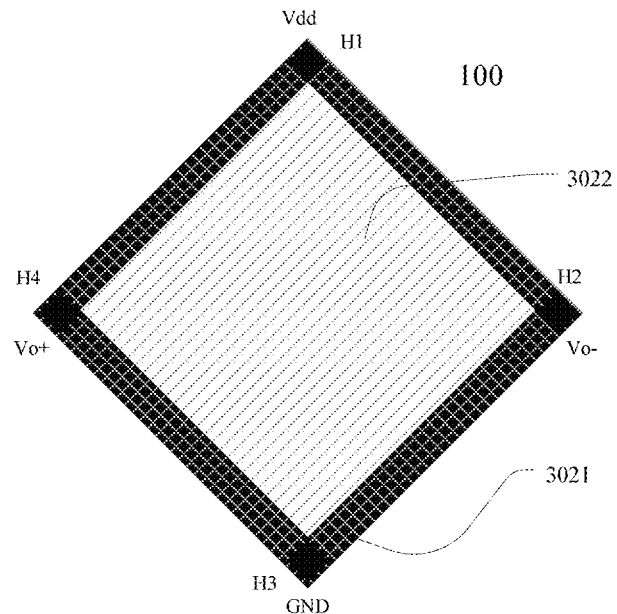
FIG. 1 is a schematic diagram of a magneto-dependent sensor provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to improve the pressure detection accuracy and reduce the cost of a display device having a pressure touch function, the embodiments of the present disclosure provides an OLED display device integrated with magneto-dependent sensors and also provides a detection circuit for a magneto-dependent sensor.

A conventional active matrix organic light-emitting diode (AMOLED) display device adopts a glass plate as a backplane and adopts thin-film transistors (TFTs) as switch elements. Tufts adopt amorphous silicon (a-Si), microcrystal silicon, low-temperature poly-silicon (LTPS) or oxide semiconductor as an active layer. A silicon-based OLED display device is distinguished from an AMOLED. The silicon-based OLED display device takes a monocrystalline silicon wafer as a substrate and forms components such as drive circuits and OLEDs on the silicon substrate. Thus, the pixel size can be reduced up to be ⅒ of that of a conventional AMOLED display device, and the resolution is far higher than that of the conventional AMOLED display device, so micro-display can be achieved. Moreover, the silicon-based OLED display device can adopt the conventional mature silicon substrate integrated circuit technology, not only can realize the active matrix addressing of display pixels but also can obtain control circuits of a variety of functions, e.g., static random access memories (SRAMs) and a timing controller (T-CON), on the silicon wafer, and hence greatly reduce external connecting lines of the display device, increase the reliability of the display device, and realize the light-weighted design of the display device.

FIG. 1 is a schematic plan view of a magneto-dependent sensor 100 formed on a silicon substrate in an embodiment of the present disclosure. After the magneto-dependent sensors 100 provided by the embodiment of the present disclosure are integrated into, for instance, the silicon-based OLED display device, the pressure applied to the display device can be measured according to the Hall effect, so touch detection can be achieved. The Hall effect refers to the physical phenomenon of lateral voltage difference produced upon the magnetic field of a magnetic field generator being applied to the carriers in a metal conductor and a semiconductor. The magnetic field generator, for instance, may be an electrified coil or a magnetic material such as magnetic ink and a magnet (natural magnet or artificial magnet). In an embodiment of the present disclosure, the magnetic field generator may be an electrified coil. In general, the magnetic field generator is below the magneto-dependent sensor(s) (for instance, one side opposite to the user). More detailed description will be given below to the examples of the magnetic field generators for the magneto-dependent sensors in the embodiment of the present disclosure.

Figure 3:
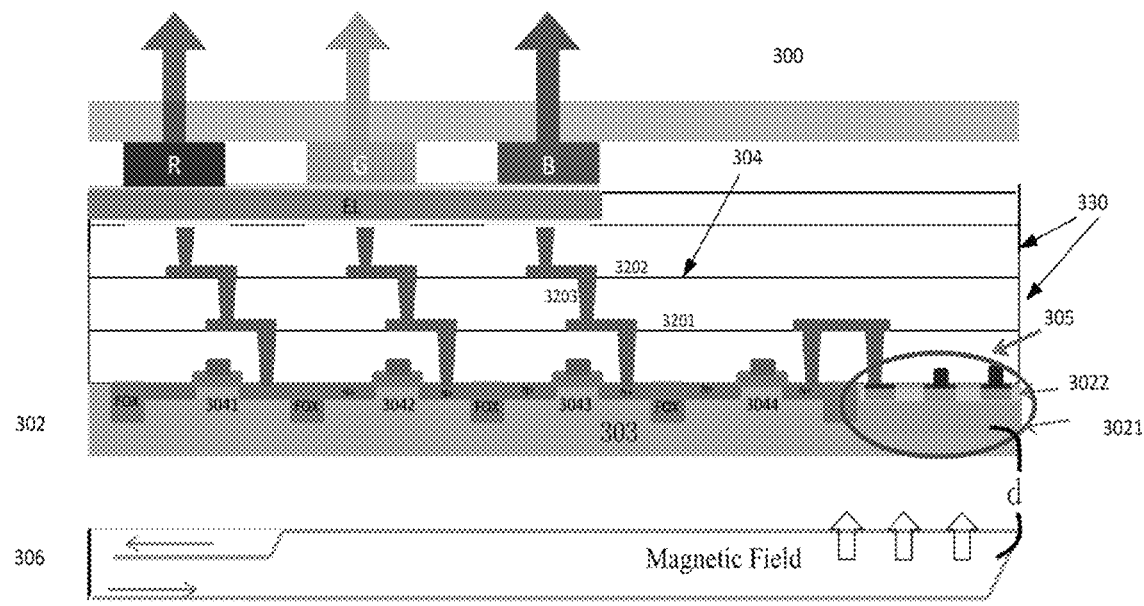
FIG. 3 is a schematic diagram of an OLED pixel unit of a display device provided by an embodiment of the present disclosure.

When the magneto-dependent sensor 100 is under the action of the magnetic field provided by the magnetic field generator, if the distance d between the magneto-dependent sensor 100 and the magnetic field generator changes (for instance, when pressed, as shown in FIG. 3), in a plane perpendicular to the magnetic field direction, the flux sensed by the magneto-dependent sensor 100 changes as well. At this point, according to the Hall effect, the magneto-dependent sensor 100 produces induction current, namely voltage difference will occur. The voltage difference corresponds to the pressure applied to the OLED display device. The displacement of the magneto-dependent sensor 100 relative to the magnetic field generator can be determined according to the voltage difference, namely the pressure applied to the magneto-dependent sensor 100 can be measured.

As shown in FIG. 1, in the embodiment of the present disclosure, the magneto-dependent sensor 100 is formed on the silicon substrate. Moreover, for instance, the magneto-dependent sensor 100 is in a shape of a square, but may also be in other shapes, e.g., be circular. The magneto-dependent sensor 100 includes a first pair of terminals and a second pair of terminals; the first pair of terminals include a first terminal H1 and a third terminal H3 disposed on one diagonal of the square, and the second pair of terminals include a second terminal H2 and a fourth terminal H4 disposed on the other diagonal of the square.

As for the magneto-dependent sensor, for instance, when a voltage $V_{dd}$ is applied in a direction perpendicular to a plane in which the magnetic field of the magneto-dependent sensor is provided, namely the voltage $V_{dd}$ is applied between the first terminal H1 and the third terminal H3, under the action of the magnetic field, moving electrons are subjected to the action of the Lorentz force of the magnetic field and are shifted, and the Hall voltage difference $U_H$ is invoked between the second terminal H2 and the fourth terminal H4. According to the Hall effect, the Hall voltage difference $U_H$ is:

$$U_H = R_H \frac{IB}{d} = K_H IB \qquad \text{Formula 1}$$

wherein, $R_H$ refers to the Hall coefficient; I refers to the current; B refers to the intensity of the magnetic field perpendicular to the current direction; d refers to the thickness of a Hall element in the magneto-dependent sensor 100; and both I and B are vectors.

As can be seen from the above formula, the Hall voltage difference $U_H$ is directionally proportional to the magnetic field intensity B, so the magnetic variation can be detected by means of calculation of the output voltage difference, and hence the magnitude or the variation of the pressure applied to the component can be obtained.

Figure 2:
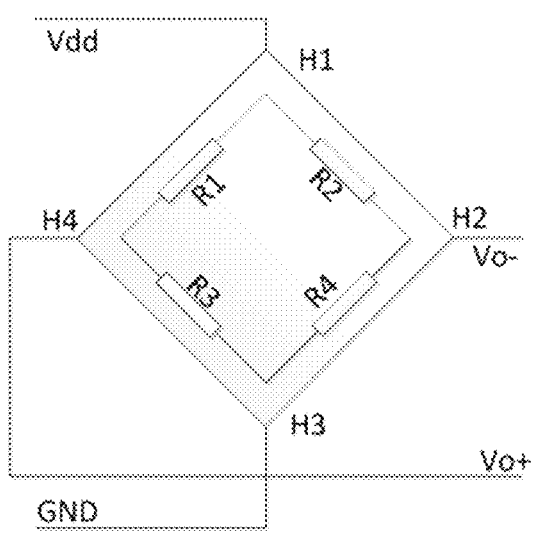
FIG. 2 is an equivalent circuit diagram of the magneto-dependent sensor provided by the embodiment of the present disclosure.

More particularly, an equivalent circuit of the magneto-dependent sensor 100 in FIG. 1 is shown in FIG. 2 and includes a Wein bridge formed by four resistors R1, R2, R3 and R4. As shown in FIG. 2, for instance, the first terminal H1 is connected with the power supply $V_{dd}$, and the third terminal H3 is grounded. In the example as shown in FIG. 2, the resistors R1, R2, R3 and R4 have same resistance, namely the circuit is an equal arm bridge circuit. The potential of the second terminal H2 and the fourth terminal H4 relative to the ground (GND) is $V_{dd}/2$, and the potential difference between the second terminal H2 and the fourth terminal H4 is 0. The magneto-dependent sensor 100 is displaced relative to the magnetic field generator when under pressure, namely the flux running through the magneto-dependent sensor 100 changes, and induction current is produced between the second terminal H2 and the fourth terminal H4, so as to form a Hall potential difference. According to the above formula 1, the direction of the Hall potential is determined by both the magnetic field direction and the current direction together. In the embodiment, as the magneto-dependent sensor 100 is horizontally placed, the magneto-dependent sensor can sense the magnetic field perpendicular to the plane provided with the magneto-dependent sensor 100. As shown in FIG. 2, an origin on the lower right corner indicates that the magnetic field direction is outwards perpendicular to the plane provided with the magneto-dependent sensor 100. The magnetic field direction produced by an electrified wire coil is roughly perpendicular to a plane of the coil, namely perpendicular to the magneto-dependent sensor 100. Therefore, the displacement of the magneto-dependent sensor 100 can be calculated by detecting the potential difference produced between the second terminal H2 and the fourth terminal H4, namely detecting the voltage difference ($V_{o+}$-$V_{o-}$) between the fourth terminal H4 and the second terminal H2, and then the pressure applied to the magneto-dependent sensor 100 can be calculated.

In the case where the magneto-dependent sensors provided by the embodiment of the present disclosure are integrated into a silicon-based OLED display device, each magneto-dependent sensor can be disposed in the display device corresponding to sub-pixels in one pixel unit or a plurality of pixel units of the display device. For instance, each magneto-dependent sensor is arranged adjacent to one pixel unit or a plurality of pixel units to form one repeating unit in the array arrangement. Description will be given below to the magneto-dependent sensors integrated into the display device by taking the OLED display device as an example.

FIG. 3 is a schematic sectional view of a pixel unit 300 of the silicon-based OLED display device provided by an embodiment of the present disclosure. The pixel unit 300 includes a pixel drive circuit, one or more electric connection layers, an OLED, etc. The OLED is connected to the pixel drive circuit through an electric connection layer. The magneto-dependent sensor is connected to a detection circuit thereof through an electric connection layer.

The pixel unit 300 may be a pixel unit emitting with light and may also be a sub-pixel unit capable of emitting light of other color(s). As shown in FIG. 3, the pixel unit 300 is a white pixel unit and includes red, blue and green filter units (color filter (CF) layers), so as to respectively form a red sub-pixel, a blue sub-pixel and a green sub-pixel. These sub-pixels respectively emit red light, blue light and green light during operation, so color display can be achieved. The white pixel unit includes an OLED element capable of emitting white light and may include a cathode, an organic electroluminescent (EL) function layer, and an anode, which are superimposed to each other in sequence, and may also include one or more organic function layers, selected from an electron transport layer (ETL), a hole transport layer (HTL), an electron injection layer (EIL), and a hole injection layer (HIL), as required.

As shown in FIG. 3, the pixel unit 300 may include a silicon substrate 302, a P-type semiconductor base 303 disposed in the silicon substrate 302, a pixel drive circuit 304 formed on the P-type semiconductor base 303 and including one or more metal-oxide-semiconductor (MOS) transistors, and a magneto-dependent sensor 305 in the silicon substrate 302. Moreover, for instance, the pixel unit may further include a magnetic field generator 306 (for instance, which is an electrified coil in FIG. 3) configured to produce magnetic field. The silicon substrate 302 may be a monocrystalline silicon (mono-Si) substrate or a mono-Si layer formed on a sapphire substrate or the like by epitaxial growth method, for instance, a silicon-on-insulator (SOI) substrate.

For instance, the magnetic field generator 306 may be disposed below the substrate 302, but the embodiment of the present disclosure is not limited thereto. For instance, the magnetic field generator 306 may also be formed in the silicon substrate 302. That is to say, the magnetic field generator may be disposed on one side of the silicon substrate 302 or formed in the silicon substrate 302. The magnetic field formed by the magnetic field generator during operation runs through (for instance, vertically runs through) the plane provided with the magneto-dependent sensor, and hence can be detected. Apart from an electrified coil capable of being electrified, the magnetic field generator 306, for instance, may also adopt other device or structure capable of producing magnetic field, e.g., a permanent-magnet material coating (e.g., a magnetic ink coating). As shown in FIG. 3, the magneto-dependent sensor 305 is integrated into the silicon substrate along with the sub-pixels of the pixel unit 300, and then is arranged side by side with the pixel units.

The drive circuit 304, for instance, may include transistors 3041, 3042 and 3043 which are configured to control the OLED, and a transistor 3044 configured to control the magneto-dependent sensor 305. The transistors 3041-3044 may be MOS transistors (n-channel metal-oxide-semiconductor (NMOS) transistors or p-channel metal-oxide-semiconductor (PMOS) transistors) and are taken as switch elements or drive elements. The transistors are spaced from each other, for instance, may be isolated from each other by insulating material field oxide (FOX) or a shallow trench.

For instance, the magneto-dependent sensor 305 may include a lightly-doped N-type semiconductor region (e.g., an n-well) 3021 formed in the P-type semiconductor base 303. For instance, the N-type semiconductor region 3021 may be formed by implanting phosphorus or other pentavalent elements into the P-type semiconductor base 303. For instance, both the N-type semiconductor region 3021 and the magneto-dependent sensor 305 are squares, circles, etc. Four vertexes of the N-type semiconductor region 3021 are subjected to n$^+$ implantation to form first, second, third and fourth n$^+$ ion-implanted regions, and then form the first, second, third and fourth terminals H1-H4 of the magneto-dependent sensor.

For instance, in one example of the embodiment, before n$^+$ implantation, one p$^+$ ion lightly-doped layer 3022 may also be formed in the N-type semiconductor region 3021. The p$^+$ ion lightly-doped layer 3022 is usually disposed in a central area of the N-type semiconductor region 3021; the periphery of the p$^+$ ion lightly-doped layer is surrounded by other parts of the N-type semiconductor region 3021; and the area of the p$^+$ ion lightly-doped layer is less than the area of the N-type semiconductor region, as shown in FIG. 1. The p$^+$ ion lightly-doped layer 3022 can increase the average resistivity of the magneto-dependent sensor and reduce the thickness of the magneto-dependent sensor 305, and hence can improve the sensitivity of the magneto-dependent sensor 305. In addition, as one silicon dioxide layer may generally cover each layer of structure in the manufacturing process, the p$^+$ ion lightly-doped layer 3022 also has the function of an electrostatic shielding layer between the N-type semiconductor region and the silicon dioxide layer, and hence can improve the stability of the magneto-dependent sensor 305.

As shown in FIG. 3, one or more electrical connection layers are formed on the silicon substrate. The electric connection layers include conductive patterns (for instance, metal layers 3201 and 3202 in the figure) formed on insulating layers 330, and the conductive patterns on different insulating layers 330 may be electrically connected with each other via through holes 3203.

The manufacturing of the magneto-dependent sensors 305 may be completed in the same semiconductor preparation process together with the manufacturing of the MOS transistors in the OLED display device. For instance, in the process of manufacturing the PMOS transistor, an N-type semiconductor region is formed first. The N-type semiconductor region 3021 of the magneto-dependent sensor 305 may be simultaneously formed in the process of forming the N-type semiconductor region of the PMOS transistor. Similarly, for instance, the $p^+$ ion lightly-doped layer 3022 may be simultaneously formed in the process of $p^+$ implantation for the manufacturing of the PMOS; and in the process of $n^+$ implantation for the leading-out of the MOS transistor, $n^+$ ion implantation may be simultaneously performed on the four vertexes of the N-type semiconductor region 3021 to obtain the $n^+$ ion-implanted regions, so as to form the four terminals of the magneto-dependent sensor. The integration of the manufacturing process of the magneto-dependent sensor 305 into the manufacturing process of the MOS transistor can reduce the manufacturing cost of the display panel.

The manufacturing process for the magneto-dependent sensor 305 may be various but not limited to that in the above description. For instance, in order to achieve better performances, the magneto-dependent sensor may also be manufactured by an independent process. Because the magneto-dependent sensor may be manufactured by an independent process, the magneto-dependent sensor provided by the embodiment of the present disclosure may also be disposed in display devices of other types, for instance, a liquid crystal display (LCD) device. It should be understood by those skilled in the art that the example as shown in FIG. 3 is only intended to better illustrates that the manufacturing process of the magneto-dependent sensor may be integrated into the manufacturing process of the OLED display device, and not intended to limit the embodiment to the case that the magneto-dependent sensor provided by the embodiment of the present disclosure can only be applied to the OLED display device.

Figure 4:
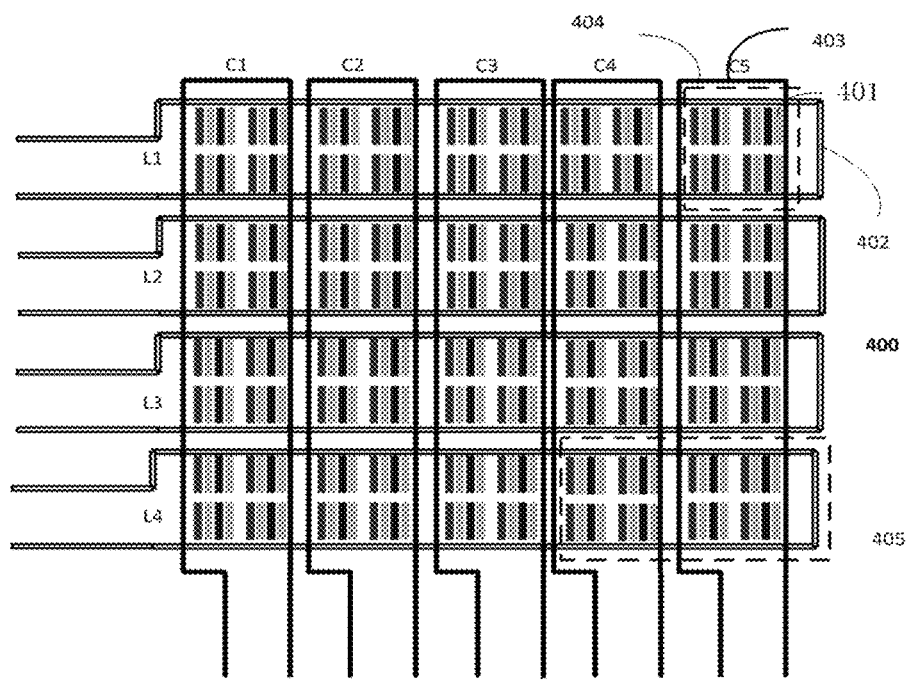
FIG. 4 is a top view of an OLED display device provided by an embodiment of the present disclosure.

As described above, the applied pressure can be sensed and converted into a voltage for output only when the magneto-dependent sensor 305 is in the magnetic field. In the embodiment as shown in FIG. 3, a coil 306 for the magnetic field generator is disposed on one side of the magneto-dependent sensor 100. For instance, the coil 306 is disposed below the substrate 302. For better description of the relationship between the coil and the display device, FIG. 4 is a top view of an OLED display device 400, including a plurality of pixel units 300 (including the magneto-dependent sensor) as shown in FIG. 3, provided by an embodiment of the present disclosure. As shown in FIG. 4, the OLED display device 400 may comprise a plurality of OLED pixel units in the embodiment as shown in FIG. 3, and these pixel units are arranged in an array. A plurality of magneto-dependent sensors 401 are arranged side by side with the plurality of pixel units. However, the embodiment of the present disclosure may comprise less or more magneto-dependent sensors 401 compared with the case as shown in FIG. 4.

The OLED display device 400 comprises at least one coil which is taken as the magnetic field generator. In the example as shown in FIG. 4, for instance, the at least one coil is a rectangular coil. For instance, in the example, the rectangular coil includes a first coil 402 disposed on a first layer and extended in a first direction (for instance, transverse direction) and a second coil 403 disposed on a second layer and extended in a second direction (for instance, longitudinal direction); and the first direction and the second direction are intersected with each other, for instance, perpendicular to each other. The first coil 402 and the second coil 403 are intersected with each other (and insulated from each other), so as to define a rectangular area in the intersected region. Each rectangular area corresponds to a magneto-dependent sensor, for instance, may cover one or more pixel units and one or more magneto-dependent sensors. As shown in FIG. 4, a rectangular area 404 includes 4 pixel units. It should be understood by those skilled in the art that the example as shown in FIG. 4 is only illustrative, and the rectangular area may include more or less pixel units according to design demands. By adoption of the above arrangement, the magnetic field may be applied in a specific area by electrifying one or more coils 402 on the first layer and one or more coils 403 on the second layer. For instance, the coil L1 and the coil C5 are selected for applying currents, and may generate magnetic field to the rectangular area 404 on the upper right corner only. Moreover, for instance, the coil L4 and coils C4-C5 are selected for applying currents, and may generate magnetic field to the rectangular area 405 on the lower right corner only. The rectangular coils may also be electrified only when detection is required, so pressure can be detected in a specific area and power consumption can be saved as much as possible. Moreover, the position on the display device, to which the pressure is applied, may also be measured, so as to achieve the detection of the touch position.

It should be understood by those skilled in the art that the rectangular coils in the embodiment of the present disclosure may only include transversely arranged coils or only include longitudinally arranged coils, and even magnetic field generators of any other shape may be adopted, as long as the magnetic field with enough intensity can be provided.

In order to detect the position and the magnitude of the pressure applied to the display device, the magneto-dependent sensors may be taken as sub-pixels and uniformly distributed in the entire display device. As shown in FIG. 2, the displacement of each magneto-dependent sensor relative to the magnetic field generator can be obtained by detecting the potential difference produced between the second terminal H2 and the fourth terminal H4 of this magneto-dependent sensor. Therefore, the second terminal H2 and the fourth terminal H4 must be connected to a signal detection circuit for detection.

Figure 5:
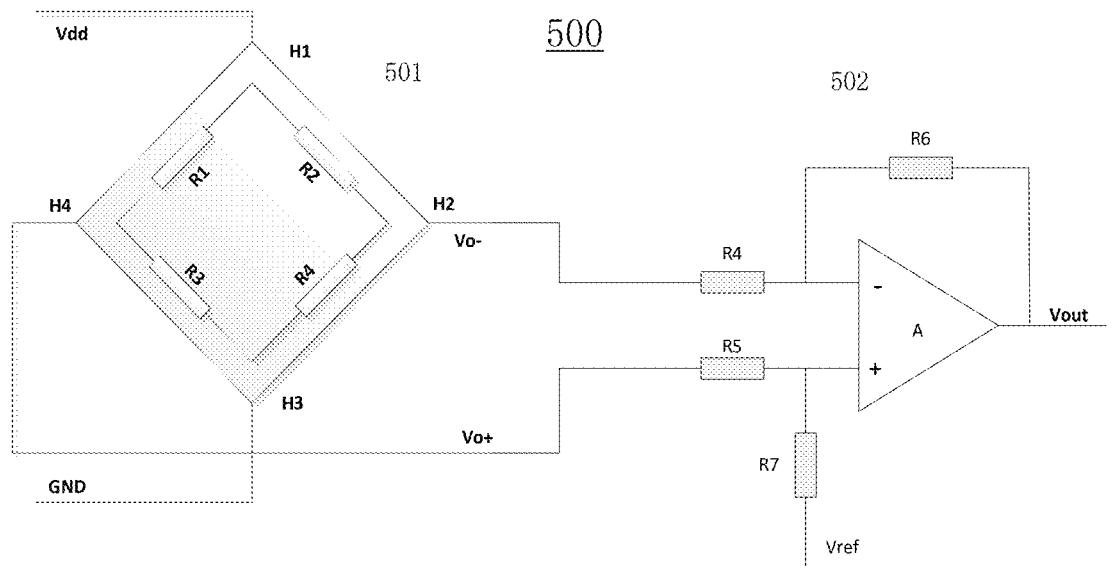
FIG. 5 is a schematic diagram of a sensor circuit provided by an embodiment of the present disclosure.

FIG. 5 is a schematic diagram of a sensor circuit 500 in the OLED display device provided by an embodiment of the present disclosure. The sensor circuit 500 includes a magneto-dependent sensor 501 and a signal detection circuit 502. The magneto-dependent sensor 501 includes a first terminal H1, a second terminal H2, a third terminal H3 and a fourth terminal H4. The signal detection circuit 502 includes a power terminal ($V_{dd}$), a ground terminal (GND), a first signal detection terminal and a second signal detection terminal. As shown in FIG. 5, the first terminal H1 of the magneto-dependent sensor 501 may be connected to the power terminal; and the third terminal H3 of the magneto-dependent sensor 501 may be connected to the ground terminal (GND). The second terminal H2 and the fourth terminal H4 of the magneto-dependent sensor 501 may be respectively connected to the first signal detection terminal and the second signal detection terminal of the signal detection circuit 502; the signal therebetween is amplified and the amplified signal is outputted. For instance, the signal detection circuit 502, for instance, includes an operational amplifier. A non-inverting input terminal (+) of the operational amplifier is connected with the second signal detection terminal; an inverting input terminal (−) of the operational amplifier is connected with the first signal detection terminal; and an output terminal (Vout) of the operational amplifier outputs the amplified voltage signal. Resistors R4, R5, R6 and R7 are correspondingly arranged for the operational amplifier. Moreover, the resistor R4 is connected with the first signal detection terminal and the inverting input terminal of the operational amplifier; the resistor R5 is connected with the second signal detection terminal and the non-inverting input terminal of the operational amplifier; the resistor R7 is connected with a reference voltage and the non-inverting input terminal of the operational amplifier; and the resistor R6 is connected with the inverting input terminal and the output terminal of the operational amplifier.

The second terminal H2 and the fourth terminal H4 of the magneto-dependent sensor 501 may be led out to the detection circuit 502 (for instance, which may include the transistors 3034 as shown in FIG. 3) through an electric connection layer (e.g., a metal layer). As shown in FIG. 3, the magneto-dependent sensor may be at least partially formed in the same layer as the pixel drive circuit for the OLED pixel unit. In the example as shown in FIG. 5, the signal detection circuit 502 includes the operational amplifier to form a differential amplifier circuit. Signals amplified by the signal detection circuit 502 can be further read by a peripheral circuit, so as to detect the variation of the magnetic field passing the magneto-dependent sensor 501, and hence the position and the magnitude of the pressure applied to the magneto-dependent sensor 501 can be calculated and displayed.

Figure 6:
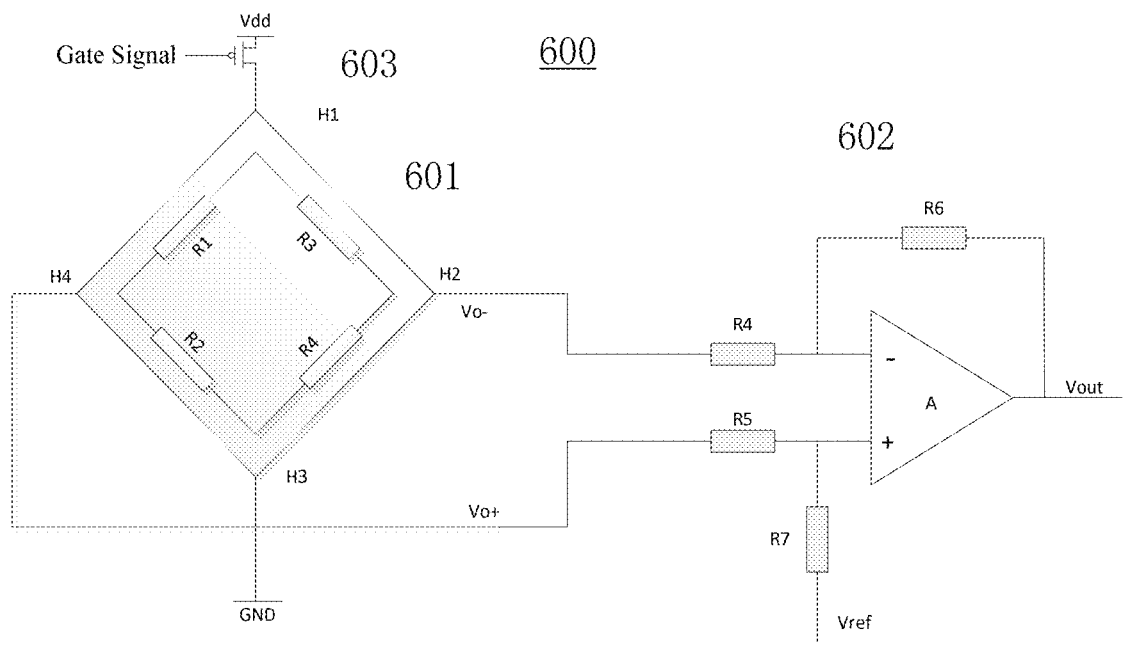
FIG. 6 is a schematic diagram of another sensor circuit provided by an embodiment of the present disclosure.

FIG. 6 is a schematic diagram of a sensor circuit 600 of the OLED display device provided by another embodiment of the present disclosure. The sensor circuit 600 includes a magneto-dependent sensor 601, a signal detection circuit 602 and a power switch element 603. For instance, the power switch element 603 may be a PMOS transistor. Compared with the embodiment as sown in FIG. 5, the first terminal H1 of the magneto-dependent sensor 601 is connected to a power terminal $V_{dd}$ via the power switch element 603. A control terminal of the power switch element 603 is connected to a control line. The OLED display device comprises a plurality of gate lines and a plurality of data lines and may further comprise a plurality of power lines. The gate lines are connected to a GOA circuit (for instance, a gate driver or a gate driver IC); the data lines are connected to a data drive circuit; and the power lines are connected to a power supply to supply power for the pixel units. For instance, the gate lines and the data lines are intersected with each other to define sub-pixel units. The control line connected with a control terminal of the power switch element 603 is, for instance, one of the gate lines. The control line is connected to the GOA circuit and may be applied with a gate drive signal. When the control line of the power switch element 603 is one of the gate lines or controlled by the GOA circuit, for instance, pressure detection may be performed when the gate signal applied to the control line is at a low level. The example allows the pixel unit and the magneto-dependent sensor to share the gate line and the gate signal. Therefore, the manufacturing process is simple, and the pressure touch driving method may also be simpler, so the cost is lowered.

Figure 9:
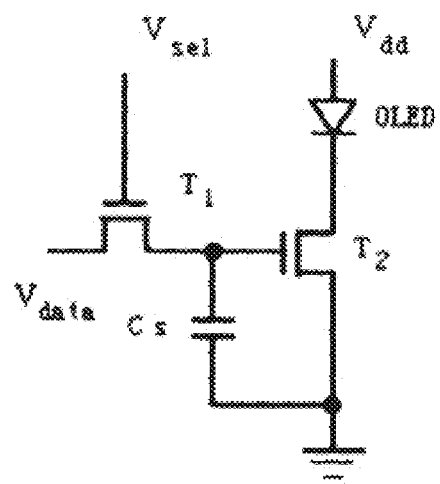
FIG. 9 is a schematic diagram of a drive circuit of the OLED pixel unit.

FIG. 9 is a schematic diagram of a drive circuit of an OLED pixel unit. As shown in FIG. 9, the drive circuit of the OLED pixel unit includes two transistors T1 and T2 and one storage capacitor Cs. A control terminal of the transistor T1 is connected with a gate line, namely applied with a selection voltage Vsel; a first end of the transistor T1 is connected with a data line and applied with grayscale data voltage; and a second end of the transistor T1 is connected with a first end of the storage capacitor Cs. A control terminal of the transistor T2 is connected with the second end of the transistor T1 and the first end of the storage capacitor Cs; a first end of the transistor T2 is connected with an OLED element; and a second end of the transistor T2 is connected with a second end of the storage capacitor Cs and is grounded. One end of the OLED element is connected with a power supply through a power line, and the other end is connected with the first end of the transistor T2. It should be understood by those skilled in the art that the embodiment of the present disclosure is not limited to application with the drive circuit of the OLED pixel unit as shown in FIG. 9, and may also adopt any known drive circuit of the OLED pixel unit, for instance, including more transistors and/or capacitors.

The sensor circuit in the embodiment as shown in FIGS. 5 and 6 may sample, amplify and output the pressure applied to the display device, and detect the magnitude or the variation of the pressure. However, the sensor (for instance, the magneto-dependent sensor provided by the embodiment of the present disclosure) may suffer from an offset voltage during operation. The offset voltage is usually caused by the manufacturing process, including the factors such as the anisotropy of materials, the nonuniformity of impurity diffusion, and the asymmetry of geometrical structures. Therefore, the sensor circuit as shown in FIGS. 5 and 6 also amplify an offset voltage component in the detection voltage while amplifying the detection voltage. This detection voltage results in inaccurate pressure detection. Therefore, the offset voltage component in the detection voltage is necessary to be eliminated.

For instance, in order to eliminate the offset voltage, in an example of the embodiment of the present disclosure, two identical magneto-dependent sensors can be manufactured, and output signals of the two magneto-dependent sensors are detected simultaneously; and subsequently, for instance, the two output signals are averaged for compensation. However, from the technical point of view, it's difficult to manufacture two identical magneto-dependent sensors, and there is not enough space in the pixel unit for the arrangement of the two magneto-dependent sensors. Therefore, the embodiment of the present disclosure provides a proposal of eliminating the offset voltage by adopting one magneto-dependent sensor only in the OLED display device.

Figure 7A:
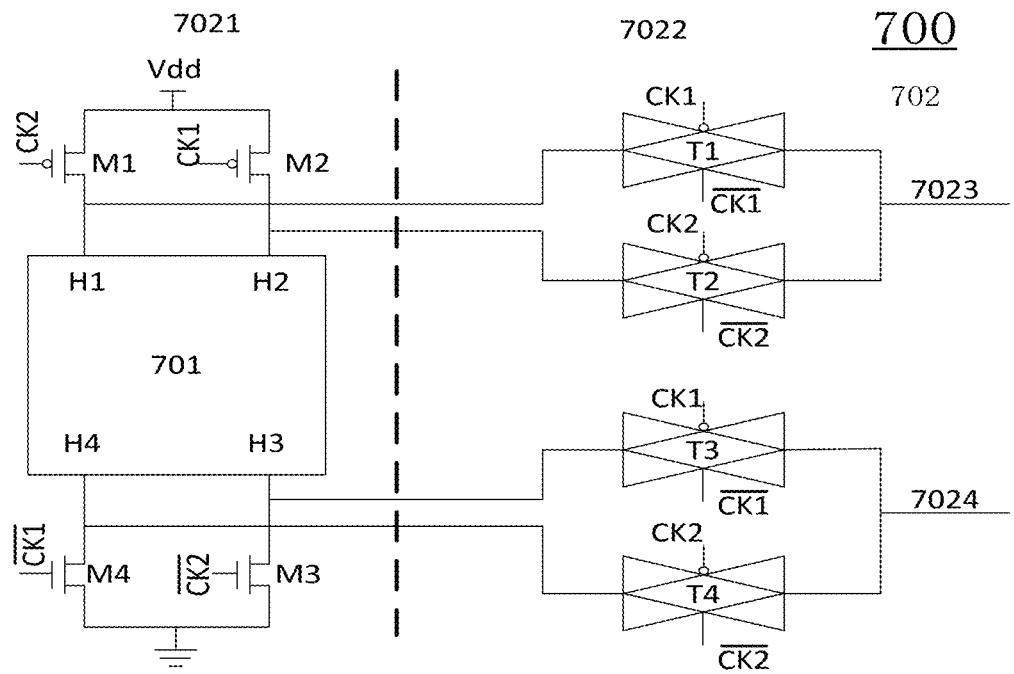
FIGS. 7a and 7b are schematic diagrams of still another sensor circuit provided by an embodiment of the present disclosure.
Figure 7B:
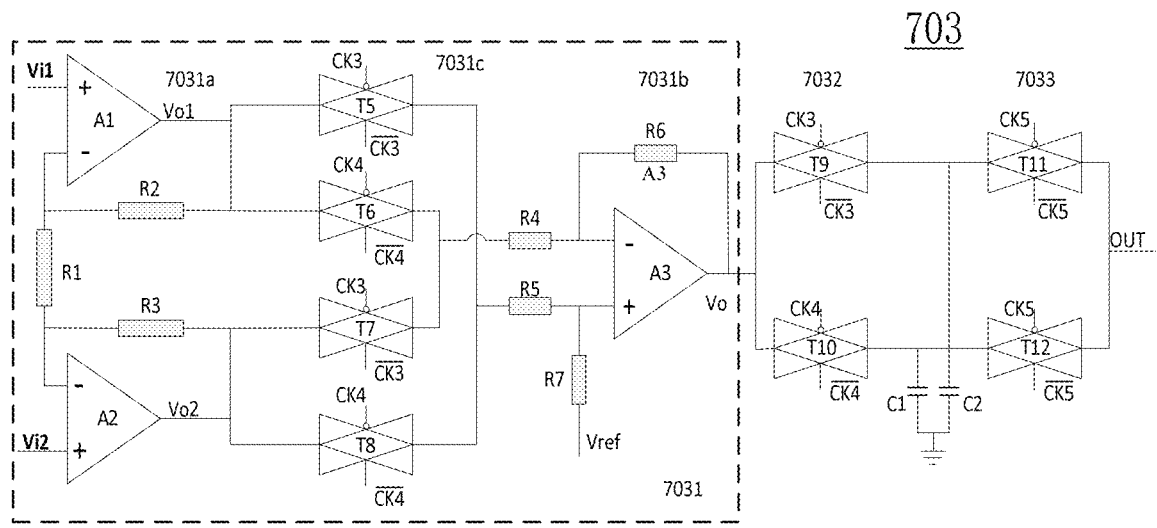

FIG. 7a is a schematic diagram of a sensor circuit provided by an embodiment of the present disclosure, and FIG. 7b is a schematic diagram illustrating the case of further adding an offset voltage cancel circuit on the basis of the embodiment as shown in FIG. 7a. In the example as shown in FIG. 7a and the example as shown in FIG. 7b, paths for inputting the detection voltage are alternately switched so that detection signals detected by the magneto-dependent sensor are respectively periodically and alternately outputted from two pair of mutually symmetrical terminals. Therefore, the compensation of the offset voltage component can be achieved by utilization of the polarity of an induction voltage component and the offset voltage component in the detection voltage.

Detailed description will be given below to the structure of the example of the sensor circuit 700 of the OLED display device and the pressure touch driving method therefore provided by an embodiment of the present disclosure.

As shown in FIG. 7a, in one example of the embodiment, the sensor circuit 700 may include a sensor 701 and a signal detection circuit 702 connected to the sensor 701. As shown in FIG. 7b, in another example of the embodiment, an offset voltage cancel circuit 703 may be further added on the basis of the sensor circuit 700 as shown in FIG. 7a. The offset voltage cancel circuit 703 is configured to amplify a signal output from the signal detection circuit 702 and eliminate the offset voltage.

As shown in FIG. 7a, the sensor circuit 700 includes the sensor 701 and the signal detection circuit 702. In the example, for instance, the sensor 701 is the magneto-dependent sensor formed on the silicon substrate in the embodiment of the present disclosure, and may also be a sensor of another type.

Figure 8:
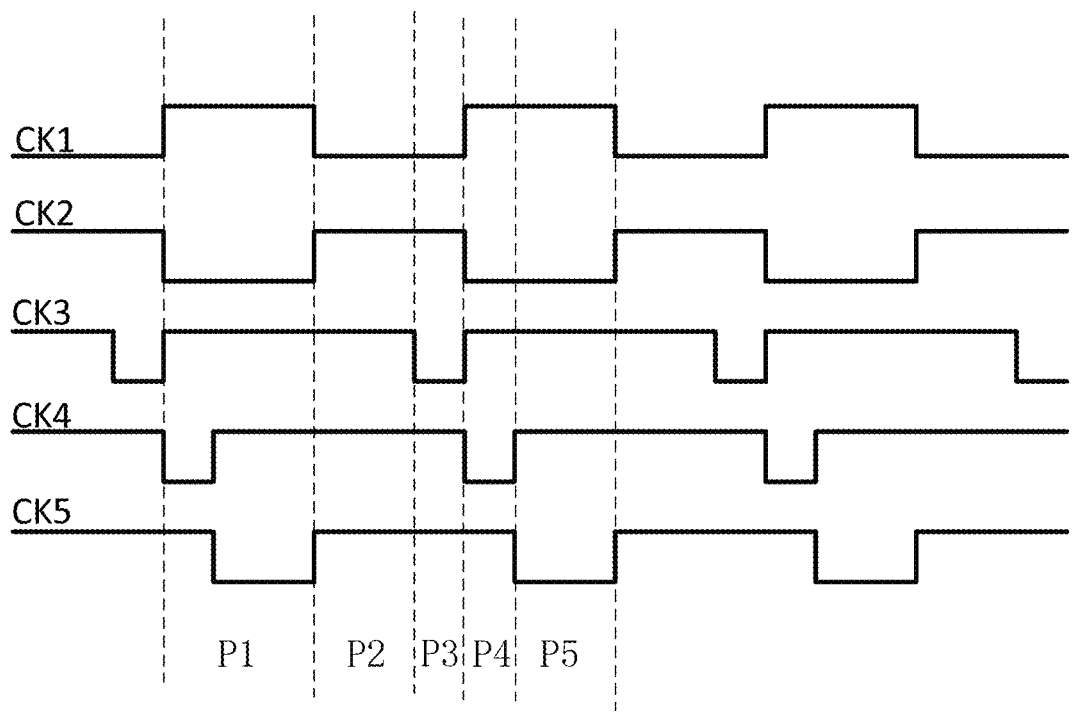
FIG. 8 is a timing diagram of first, second, third, fourth and fifth control signals in the embodiment of the present disclosure.

As shown in FIG. 7a, the signal detection circuit 702 may include a detection voltage input sub-circuit 7021 and an induction signal output sub-circuit 7022. As described above, the sensor 701 may include a first pair of terminals (H1, H3) and a second pair of terminals (H2, H4). The detection voltage input sub-circuit 7021 may be configured to be connected with the first pair of terminals in the first period P1 and connected with the second pair of terminals in the second period P2. The relationship between the first period P1 and the second period P2 is, for instance, as shown in FIG. 8. The induction signal output sub-circuit 7022 includes a first output terminal 7023 and a second output terminal 7024 and is configured to be able to allow the first and second output terminals to be respectively connected with the second pair of terminals of the sensor 701 to output a first detection voltage in the first period P1, and allow the first and second output terminals to be respectively connected with the first pair of terminals of the sensor 701 to output a second detection voltage in the second period P2. The first period P1 and the second period P2 are different from each other.

In some embodiments, the detection voltage input sub-circuit 7021 may include a first switch element M1, a second switch element M2, a third switch element M3 and a fourth switch element M4 which are respectively connected with the first terminal H1, the second terminal H2, the third terminal H3 and the fourth terminal H4 of the sensor 701. The induction signal output sub-circuit 7022 may include a fifth switch element T1, a sixth switch element T2, a seventh switch element T3 and an eighth switch element T4.

In the example as shown in FIG. 7a, the sensor 701 is a square magneto-dependent sensor. Therefore, the first terminal H1, the second terminal H2, the third terminal H3 and the fourth terminal H4 are structurally essentially equivalent terminal points.

Description will be given below to the examples of the first switch element M1, the second switch element M2, the third switch element M3 and the fourth switch element M4 in the detection voltage input sub-circuit 7021.

One end of the first switch element M1 is coupled to the power supply $V_{dd}$, and the other end is coupled to the first terminal H1 of the sensor 701; a control terminal is connected with a timing controller (not shown); and the first switch element is switched on or off according to a second control signal CK2. In the example as shown in FIG. 6a, the first switch element M1 may be a PMOS transistor and is switched on when the second control signal CK2 is at a low level.

One end of the second switch element M2 is coupled to the power supply $V_{dd}$, and the other end is coupled to the second terminal H2 of the sensor 701; a control terminal is connected with the timing controller; and the second switch element is switched on or off according to a first control signal CK1. In the example as shown in FIG. 6a, the second switch element M2 may be a PMOS transistor and is switched on when the first control signal CK1 is at a low level. Herein, the supply voltage $V_{dd}$ may be set as required.

One end of the third switch element M3 is coupled to the ground, and the other end is coupled to the third terminal H3 of the sensor 701; a control terminal is connected with the timing controller; and the third switch element is switched on or off according to the second control signal CK2. In the example as shown In FIG. 6a, the third switch element M3 may be an NMOS transistor and is switched on when a reverse signal of the second control signal CK2 is at a high level.

One end of the fourth switch element M4 is coupled to the ground, and the other is coupled to the fourth terminal H4 of the sensor 701; a control terminal is connected with the timing controller; and the fourth switch element is switched on or off according to the first control signal CK1. In the example as shown in FIG. 6a, the fourth switch element M4 may be an NMOS transistor and is switched on when a reverse signal of the first control signal CK1 is at a high level.

Description will be given below to the examples of the fifth switch element T1, the sixth switch element T2, the seventh switch element T3 and the eighth switch element T4 in the induction signal output sub-circuit 7022.

One end of the fifth switch element T1 is coupled with the first terminal H1 of the sensor 701, and the other end is coupled with the first output terminal 7023; a control terminal is connected with the timing controller (not shown); and the fifth switch element is switched on or off according to the first control signal CK1.

One end of the sixth switch element T2 is coupled with the second terminal H2 of the sensor 701, and the other is coupled with the first output terminal 7023; a control terminal is connected with the timing controller; and the sixth switch element is switched on or off according to the second control signal CK2.

One end of the seventh switch element T3 is coupled with the third terminal H3, and the other end is coupled with the second output terminal 7024; a control terminal is connected with the timing controller; and the seventh switch element is switched on or off according to the first control signal CK1.

One end of the eighth switch element T4 is coupled with the fourth terminal H4, and the other end is coupled with the second output terminal 7024; a control terminal is connected with the timing controller; and the eighth switch element is switched on or off according to the second control signal CK2.

In FIG. 7a, for instance, the fifth switch element T1 and the seventh switch element T3 are configured to be switched on in response to the low level of the first control signal CK1, and the sixth switch element T2 and the eighth switch element T4 are configured to be switched on in response to the low level of the second control signal CK2. For instance, the fifth, sixth, seventh and eighth switch elements may be configured as transmission gates, but the specific types of the above switch elements are not limited in the embodiments of the present disclosure.

FIG. 8 shows the example of the level relationship and the timing relationship between the first control signal CK1 and the second control signal CK2. In FIG. 8, in a preferred implementation, the first control signal CK1 and the second control signal CK2 are reverse signals of each other with same frequency. That is to say, when the first control signal CK1 is at a high level, the second control signal CK2 is at a low level. Therefore, in the first period P1 at which the first control signal CK1 is at the high level and the second control signal CK2 is at the low level, the detection voltage input sub-circuit 7021 is connected with the first pair of terminals (H1, H3) of the sensor 701 in the first period P1, and the induction signal output sub-circuit 7022 is connected with the second pair of terminals (H2, H4) so as to output the first detection voltage in the first period P1. In the second period P2 at which the first control signal CK1 is at the low level and the second control signal CK2 is at the high level, the detection voltage input sub-circuit 7021 is connected with the second pair of terminals of the sensor in the second period P2, and the induction signal output sub-circuit 7022 is connected with the first pair of terminals so as to output the second detection voltage in the second period P2.

By setting of the timing sequence of the first control signal CK1 and the second control signal CK2, the signal detection circuit 702 alternately applies the detection voltage to the first pair of terminals and the second pair of terminals of the sensor 701, and the induction signal output sub-circuit 7022 alternately reads the first detection voltage and the second detection voltage from the second pair of terminals and the first pair of terminals of the sensor 701, outputs the first detection voltage in the first period P1, and outputs the second detection voltage in the second period P2. The first detection voltage includes an induction voltage component and an offset voltage component, and the second detection voltage includes an induction voltage component and an offset voltage component as well; the polarity of the induction voltage component of the first detection voltage is opposite to the polarity of the induction voltage component of the second detection voltage, but the offset voltage components of both are in phase. It should be understood by those skilled in the art that the timing relationship and the level relationship between the first control signal CK1 and the second control signal CK2 are not limited to the example as shown in FIG. 8, as long as the first detection voltage and the second detection voltage can be alternately read from the sensor 701 and outputted.

The first detection voltage and the second detection voltage detected by the signal detection circuit 702 are inputted into the offset voltage cancel circuit 703. As shown in FIG. 7b, the offset voltage cancel circuit 703 may include a first input terminal Vi1, a second input terminal Vi2, an amplifying sub-circuit 7031, a selection sub-circuit 7032, a first capacitor C1, a second capacitor C2, and an output sub-circuit 7033. The first output terminal 7023 and the second output terminal 7024 of the induction signal output sub-circuit 7022 are respectively connected with the first input terminal Vi1 and the second input terminal Vi2 of the offset voltage cancel circuit 703.

The amplifying sub-circuit 7031 may be configured to amplify the first detection voltage which is taken as the first amplifying voltage and outputted, and reversely amplify the second detection voltage which is taken as the second amplifying voltage and outputted.

In the example as shown in FIG. 7b, the amplifying sub-circuit 7031 may include a first-level amplifying sub-circuit 7031a, a second-level amplifying sub-circuit 7031b, and a control circuit 7031c disposed between them. The first-level amplifying sub-circuit 7031a includes a first operational amplifier A1 and a second operational amplifier A2. The control circuit 7031c includes four switch elements, namely ninth, tenth, eleventh and twelfth switch elements, respectively marked as T5, T6, T7 and T8 in FIG. 7b. The second-level amplifying sub-circuit includes a third operational amplifier A3.

A non-inverting input terminal (+) of the first operational amplifier A1 is connected with the first output terminal 7023 of the signal detection circuit 702, and an output terminal of the first operational amplifier A1 is connected with a first end of the ninth switch element T5 and a first end of the tenth switch element T6. A non-inverting input terminal (+) of the second operational amplifier A2 is connected with the second output terminal 7024 of the signal detection circuit 702, and an output terminal of the second operational amplifier A2 is connected with a first end of the eleventh switch element T7 and a first end of the twelfth switch element T8. An inverting input terminal (−) of the first operational amplifier A1 and an inverting input terminal (−) of the second operational amplifier A2 are connected with each other, for instance, connected with each other through the resistor R1.

In addition, in FIG. 7b, one end of the resistor R2 is connected to the inverting input terminal (−) of the first operational amplifier A1, and the other end is connected to the output terminal of the first operational amplifier A1 and then connected to the first end of the ninth switch element T5 and the first end of the tenth switch element T6. One end of the resistor R3 is connected to the inverting input terminal (−) of the second operational amplifier A2, and the other end is connected to the output terminal of the second operational amplifier A2 and then connected to the first end of the eleventh switch element T7 and the first end of the twelfth switch element T8. A second end of the ninth switch element T5 and a second end of the twelfth switch element T8 are connected to a non-inverting input terminal (+) of the third operational amplifier A3 through the resistor R5. A second end of the tenth switch element T6 and a second end of the eleventh switch element T7 are connected to an inverting input terminal (−) of the third operational amplifier A3 through the resistor R4. An output terminal of the third operational amplifier A3 is connected to an input terminal of the selection sub-circuit 7032.

Control terminals of the ninth switch element T5, the tenth switch element T6, the eleventh switch element T6 and the twelfth switch element T8 are respectively connected to the timing controller (not shown). During operation, for instance, the ninth switch element T5 and the eleventh switch element T7 are applied with a third control signal CK3 and then switched on in the third period P3. For instance, the tenth switch element T6 and the twelfth switch element T8 are applied with a fourth control signal CK4 and then switched on in the fourth period P4.

Therefore, the first detection voltage and the second detection voltage are respectively amplified by the first operational amplifier A1 and the second operational amplifier A2 in the first-level amplifying sub-circuit. The amplified first detection voltage and the amplified second detection voltage are respectively applied to the non-inverting input terminal and the inverting input terminal of the second-level amplifying sub-circuit (for instance, the third operational amplifier A3), and the first amplifying voltage and the second amplifying voltage are respectively outputted.

It should be known by those skilled in the art that: if the amplification ability is sufficient, the amplifying sub-circuit 7031 may only include the second-level amplifying sub-circuit (for instance, the third operational amplifier A3) and does not need to arrange the first-level amplifying sub-circuit. Any amplifying sub-circuit, capable of performing non-inverting amplification on the first detection voltage which is taken as the first amplifying voltage for output and performing inverting amplification on the second detection voltage which is taken as the second amplifying voltage for output, may be taken as the amplifying sub-circuit 7031.

The selection sub-circuit 7032 may include a thirteenth switch element T9 and a fourteenth switch element T10. Output terminals of the switch elements T9 and T10 (namely the output terminal of the selection sub-circuit 7032) are respectively connected to a second end of the second capacitor C2 and a second end of the first capacitor C1; both input terminals of the switch elements T9 and T10 are connected with the output terminal of the amplifying sub-circuit 7031; and both control terminals of the switch elements T9 and T10 are connected with the timing controller. Both the first end of the first capacitor C1 and the first end of the second capacitor C2 are connected to the ground and connected with each other. According to the characteristics of the operational amplifier, a signal inputted into the non-inverting input terminal is subjected to non-inverting amplification, and a signal inputted into the inverting input terminal is subjected to inverting amplification.

In order to respectively store the obtained first amplifying voltage and the obtained second amplifying voltage into the first capacitor C1 and the second capacitor C2, the selection sub-circuit 7032 may be configured to be switched on in the third period P3 according to the third control signal CK3, so as to store the first amplifying voltage into the second capacitor C2, and be switched on in the fourth period P4 according to the fourth control signal CK4, so as to store a reverse voltage of the second amplifying voltage into the first capacitor C1. For instance, as shown in FIGS. 6b and 7, in the third period P3, the third control signal CK3 is in low level; the switch element T9 is switched on in response to the low level of the third control signal CK3 (for instance, the switch element T9 may be a PMOS transistor connected to a control gate through the third control signal CK3); and then the first amplifying voltage is stored into the second capacitor C2 in the third period P3 (namely the third control signal CK3 is in low level). Similarly, in the fourth period P4, the fourth control signal CK4 is at a low level; the switch element T10 is switched on in response to the low level of the fourth control signal CK4 (for instance, the switch element T10 may be a transmission gate); and then the second amplifying voltage is stored into the second capacitor C2 in the fourth period P4 (namely the fourth control signal CK4 is in low level).

As described above, the first detection voltage includes an induction voltage component and an offset voltage component, and the second detection voltage includes an induction voltage component and an offset voltage component; the polarity of the induction voltage component of the first detection voltage is opposite to the polarity of the induction voltage component of the second detection voltage, but the offset voltage components of both are in phase. As the first amplifying voltage is an inverting amplifying signal of the first detection voltage and the second amplifying voltage is a non-inverting amplifying signal of the second detection voltage, the first amplifying voltage and the second amplifying voltage have opposite induction voltage components and same offset voltage components.

Therefore, when the first end of the first capacitor C1 is connected with the first end of the second capacitor C2, because the first amplifying voltage and the second amplifying voltage have opposite induction voltage components and same offset voltage components, after the reallocation of the charges of the capacitor C1 and the capacitor C2, the offset voltage is just eliminated, and only the induction voltage component in the first detection voltage and the induction voltage component in the second detection voltage are retained. Therefore, accurate induction voltage component after the elimination of the offset voltage can be obtained.

Therefore, the output sub-circuit 7033 may include a fifteenth switch element T11 and a sixteenth switch element T12. One end of the first capacitor C1 is also connected to the sixteenth switch element T12; one end of the second capacitor C2 is also connected to the fifteenth switch element T11; output terminals of the fifteenth switch element T11 and the sixteenth switch element T12 are connected with each other; and control terminals of the fifteenth switch element T11 and the sixteenth switch element T12 are connected with the timing controller. For instance, the output sub-circuit 7033 may be configured to connect the first end of the first capacitor C1 and the first end of the second capacitor C2 in the fifth period P5 according to a fifth control signal CK5. That is to say, in the fifth period P5, the first capacitor C1 and the second capacitor C2 are in parallel connection through the output sub-circuit 7033, so the offset voltage components with same amplitude and opposite polarities in the first capacitor C1 and the second capacitor C2 can cancel each other.

The timing relationship among first, second, third, fourth and fifth control signals, for instance, refer to FIG. 8. As can be seen from FIG. 8, in order to improve the efficiency of the sensor circuit, the third period P3, the fourth period P4 and the fifth period P5 are partially overlapped with the first period P1 and the second period P2 of the next cycle. It should be known by those skilled in the art that the third period P3, the fourth period P4 and the fifth period P5 may also be not overlapped with the first period P1 and the second period P2 of the next cycle.

As described above, by means of arrangement of the first capacitor C1 and the second capacitor C2, the detection signal is transmitted in different periods and subjected to non-inverting amplification and inverting amplification, so the inherent offset voltage of the sensor can be eliminated by adoption of only one sensor.

In order to reduce power consumption and avoid signal crosstalk, the operation of the display device is divided into a display period and a pressure detection period. In the display period, the display device achieves the operation of image display (for instance, progressive scanning or interlaced scanning); the magnetic field generator for generating the magnetic field (which is a wire coil in the embodiment of the present disclosure) is not electrified; and the sensor and the signal detection circuit of the sensor do not operate. In the pressure detection period, the display device does not execute the operation of image display; the magnetic field generator is electrified; and the sensor and the signal detection circuit of the sensor operate.

Therefore, the magneto-dependent sensor provided by the embodiment of the present disclosure can detect the slight or minor variation of the magnetic field from the inside of the display device, and detect the pressure applied to the magneto-dependent sensor according to the slight or minor variation of the magnetic field. Apart from the above, the magneto-dependent sensor provided by the embodiment of the present disclosure can also detect the magnetic field from the outside of the display device, e.g., a magnetic pen. For instance, in order to better detect the external magnetic field, e.g., the magnetic field from the other side of the display device opposite to the substrate, a cathode layer on the magneto-dependent sensor may be cut by laser ablation to form a window, or the cathode layer is not formed in an area over the magneto-dependent sensor.

An embodiment of the present disclosure further provides a sensor circuit, which comprises a sensor and a signal detection circuit connected to the sensor. The sensor includes a first pair of terminals and a second pair of terminals; the first pair of terminals and the second pair of terminals are electrically symmetrical to each other; for instance, the first pair of thermals are configured to receive input signals and the second pair of terminals are configured to output induction signals, or the second pair of terminals are configured to receive the input signals and the first pair of terminals are configured to output the induction signals; the first pair of terminals include a first terminal and a third terminal; the second pair of terminals include a second terminal and a fourth terminal; the signal detection circuit includes a detection voltage input sub-circuit and an induction signal output sub-circuit; the detection voltage input sub-circuit is configured to be connected with the first pair of terminals in the first period, and be connected with the second pair of terminals in the second period; the induction signal output sub-circuit includes a first output terminal and a second output terminal and is configured to be able to allow the first output terminal and the second output terminal to be respectively connected with the second pair of terminals to output first detection voltage in the first period, and allow the first output terminal and the second output terminal to be respectively connected with the first pair of terminals to output second detection voltage in the second period; and the first period is different from the second period.

In one example of the sensor circuit, the polarity of an induction voltage component in the first detection voltage outputted by the second pair of terminals is opposite to the polarity of an induction voltage component in the second detection voltage outputted by the first pair of terminals.

In one example of the sensor circuit, the sensor is a magneto-dependent sensor.

In one example of the sensor circuit, the detection voltage input sub-circuit includes first, second, third and fourth switch elements; one end of the first switch element is coupled to the power supply, and the other end is coupled to the first terminal; the first switch element is switched on in the second period; one end of the second switch element is coupled to the power supply, and the other end is coupled to the second terminal; the second switch element is switched on in the first period; one end of the third switch element is coupled to the ground, and the other end is coupled to the third terminal; the third switch element is switched on in the second period; one end of the fourth switch element is coupled to the ground, and the other end is coupled to the fourth terminal; and the fourth switch element is switched on in the first period.

In one example of the sensor circuit, the induction signal output sub-circuit further includes fifth, sixth, seventh and eighth switch elements; one end of the fifth switch element is coupled with the first terminal, and the other end is coupled with the first output terminal; the fifth switch element is switched on in the first period; one end of the sixth switch element is coupled with the second terminal, and the other end is coupled with the first output terminal; the sixth switch element is switched on in the second period; one end of the seventh switch element is coupled with the third terminal, and the other end is coupled with the second output terminal; the seventh switch element is switched on in the first period; one end of the eighth switch element is coupled with the fourth terminal, and the other end is coupled with the second output terminal; and the eighth switch element is switched on in the second period.

In one example of the sensor circuit, the first, second, third, fourth, fifth, sixth, seventh and eighth switch elements are NMOS transistors and/or PMOS transistors.

In one example of the sensor circuit, the sensor circuit further comprises an offset voltage cancel circuit. The offset voltage cancel circuit includes a first input terminal, a second input terminal, an amplifying sub-circuit, a selection sub-circuit, a first capacitor, a second capacitor and an output sub-circuit; the first input terminal and the second input terminal of the offset voltage cancel circuit correspond to the first output terminal and the second output terminal of the induction signal output sub-circuit, so as to respectively receive the first detection voltage and the second detection voltage; the amplifying sub-circuit is configured to respectively amplify the first detection voltage which is taken as the first amplifying voltage, and reversely amplify the second detection voltage which is taken as the second amplifying voltage; the selection sub-circuit is configured to store the first amplifying voltage into the second capacitor in the third period, and store the second amplifying voltage into the first capacitor in the fourth period, and the third period is different from the fourth period; a first end of the first capacitor is connected with a first end of the second capacitor; and the output sub-circuit is configured to be able to allow the first capacitor and the second capacitor to be in parallel connection and output the voltage in the fifth period.

In one example of the sensor circuit, the amplifying sub-circuit includes a first amplifying sub-circuit and a second amplifying sub-circuit in series connection with the first amplifying sub-circuit; the first amplifying sub-circuit amplifies the first detection voltage and the second detection voltage and inputs the first detection voltage and the second detection voltage into the second amplifying sub-circuit; and the second amplifying sub-circuit further performs non-inverting amplification on the amplified first detection voltage, and further performs inverting amplification on the amplified second detection voltage.

In one example of the sensor circuit, the first amplifying sub-circuit includes a first operational amplifier, a second operational amplifier, and ninth, tenth, eleventh and twelfth switch elements; the second amplifying sub-circuit includes a third operational amplifier; a non-inverting input terminal of the first operational amplifier is connected with the first input terminal of the offset voltage cancel circuit; a non-inverting input terminal of the second operational amplifier is connected with the second input terminal of the offset voltage cancel circuit; an inverting input terminal of the first operational amplifier is connected with an inverting input terminal of the second operational amplifier; one end of the ninth switch element is connected with an output terminal and the inverting input terminal of the first operational amplifier, and the other end is connected with a non-inverting input terminal of the third operational amplifier; the ninth switch element is switched on in the third period; one end of the tenth switch element is connected with the output terminal and the inverting input terminal of the first operational amplifier, and the other end is connected with an inverting input terminal of the third operational amplifier; the tenth switch element is switched on in the fourth period; one end of the eleventh switch element is connected with an output terminal and the inverting input terminal of the second operational amplifier, and the other end is connected with the inverting input terminal of the third operational amplifier; the eleventh switch element is switched on in the third period; one end of the twelfth switch element is connected with the output terminal and the inverting input terminal of the second operational amplifier, and the other is connected with the non-inverting input terminal of the third operational amplifier; and the twelfth switch element is switched on in the fourth period.

In one example of the sensor circuit, the selection sub-circuit includes a thirteenth switch element and a fourteenth switch element; one end of the thirteenth switch element is connected with the output terminal of the amplifying sub-circuit, and the other end is connected with the second end of the second capacitor; the thirteenth switch element is switched on in the third period; one end of the fourteenth switch element is connected with the output terminal of the amplifying sub-circuit, and the other is connected with the second end of the first capacitor; and the fourteenth switch element is switched on in the fourth period.

In one example of the sensor circuit, the output sub-circuit includes a fifteenth switch element and a sixteenth switch element; one end of the fifteenth switch element is connected with an output terminal of the output sub-circuit, and the other end is connected with the second end of the second capacitor; the fifteenth switch element is switched on in the fifth period; one end of the sixteenth switch element is connected with the output terminal of the output sub-circuit, and the other end is connected with the second end of the second capacitor; and the sixteenth switch element is switched on in the fifth period.

The sensor circuit provided by the embodiment of the present disclosure can detect the magnitude of the pressure applied to the display device, and eliminate the possible inherent offset voltage of the sensor via a corresponding signal detection circuit by adoption of only one sensor.

What are described above is related to the illustrative embodiments of the disclosure only and not limitative to the scope of the disclosure; the scopes of the disclosure are defined by the accompanying claims.

The application claims priority to the Chinese patent application No. 201610585740.5, filed Jul. 22, 2016, the entire disclosure of which is incorporated herein by reference as part of the present application.

What is claimed is:

1. A pressure touch driving method of an organic light-emitting diode (OLED) display device, the OLED display device comprising a silicon substrate, a pixel unit and a magneto-dependent sensor which are on one side of the silicon substrate, and a magnetic field generator configured to provide magnetic fields running through a plane provided with the magneto-dependent sensor to the magneto-dependent sensor, wherein the magneto-dependent sensor is configured to detect magnetic variation and convert the magnetic variation into a voltage difference for output, the pressure touch driving method comprising:
providing the magnetic fields running through the plane provided with the magneto-dependent sensor to the magneto-dependent sensor;
detecting the magnetic variation through the magneto-dependent sensor;
converting the magnetic variation into a voltage and outputting the voltage; and
identifying a touch position and a pressure value.

2. The pressure touch driving method according to claim 1, wherein the magneto-dependent sensor comprises a first terminal, a second terminal, a third terminal and a fourth terminal; the first terminal is arranged opposite to the third terminal to provide a first pair of terminals; the second terminal is arranged opposite to the fourth terminal to provide a second pair of terminals; and the pressure touch driving method further comprises:
in a first detection period, controlling the first pair of terminals of the magneto-dependent sensor to receive an input signal, and the second pair of terminals to output a first detection voltage;
in a second detection period, controlling the second pair of terminals of the magneto-dependent sensor to receive the input signal, and the first pair of terminals to output a second detection voltage; and
a polarity of an induction voltage component in the first detection voltage is opposite to a polarity of an induction voltage component in the second detection voltage.

3. An organic light-emitting diode (OLED) display device, comprising:
a silicon substrate;
a pixel unit and a magneto-dependent sensor which are on one side of the silicon substrate; and
a magnetic field generator configured to provide magnetic fields running through a plane provided with the magneto-dependent sensor to the magneto-dependent sensor, wherein
the magneto-dependent sensor is configured to detect magnetic variation and convert the magnetic variation into a voltage difference for output.

4. The OLED display device according to claim 3, wherein the magnetic field generator is on the other side of the silicon substrate and/or inside the silicon substrate and is at least partially overlapped with the magneto-dependent sensor.

5. The OLED display device according to claim 3, wherein the magneto-dependent sensor comprises a first terminal, a second terminal, a third terminal and a fourth terminal; the first terminal is arranged opposite to the third terminal to provide a first pair of terminals; the second terminal is arranged opposite to the fourth terminal to provide a second pair of terminals; and
the first pair of terminals are configured to receive input signals and the second pair of terminals are configured to output induction signals, or the second pair of terminals are configured to receive the input signals and the first pair of terminals are configured to output the induction signals.

6. The OLED display device according to claim 5, wherein the magneto-dependent sensor comprises: a P-type semiconductor base, an N-type semiconductor region in the P-type semiconductor base, and a first n+ ion-implanted region, a second n+ ion-implanted region, a third n+ ion-implanted region and a fourth n+ ion-implanted region in the N-type semiconductor region; and
the first n+ ion-implanted region is the first terminal of the magneto-dependent sensor; the second n+ ion-implanted region is the second terminal of the magneto-dependent sensor; the third n+ ion-implanted region is the third terminal of the magneto-dependent sensor; and the fourth n+ ion-implanted region is the fourth terminal of the magneto-dependent sensor.

7. The OLED display device according to claim 6, wherein the N-type semiconductor region is a square N-type semiconductor region; and the first n+ ion-implanted region, the second n+ ion-implanted region, the third n+ ion-implanted region and the fourth n+ ion-implanted region are respectively sequentially arranged on four corners of the square N-type semiconductor region.

8. The OLED display device according to claim 7, wherein a p+ ion lightly-doped layer is also between the P-type semiconductor base and the N-type semiconductor region; an area of the p+ ion lightly-doped layer is less than an area of the N-type semiconductor region; and the p+ ion lightly-doped layer covers a central area of the N-type semiconductor region.

9. The OLED display device according to claim 3, wherein the magnetic field generator comprises at least one electrified coil.

10. The OLED display device according to claim 9, wherein the at least one electrified coil comprises a coil arranged in a first layer and along a first direction and a coil arranged in a second layer and along a second direction; the first direction is intersected with the second direction;
there is an overlapped area between the coil in the first layer and the coil in the second layer; and
an orthographic projection of the overlapped area on the silicon substrate is at least partially overlapped with an orthographic projection of the magneto-dependent sensor on the silicon substrate.

11. The OLED display device according to claim 5, further comprising a signal detection circuit, wherein the signal detection circuit is connected with the magneto-dependent sensor.

12. The OLED display device according to claim 11, wherein the signal detection circuit comprises a power supply terminal, a ground terminal, a first signal detection terminal and a second signal detection terminal;
the power supply terminal is connected with the first terminal of the magneto-dependent sensor;
the ground terminal is connected with the third terminal of the magneto-dependent sensor;
the first signal detection terminal is connected with the second terminal of the magneto-dependent sensor; and
the second signal detection terminal is connected with the fourth terminal of the magneto-dependent sensor.

13. The OLED display device according to claim 12, wherein the signal detection circuit further comprises an operational amplifier;
a non-inverting input terminal of the operational amplifier is connected with the second signal detection terminal; and an inverting input terminal of the operational amplifier is connected with the first signal detection terminal.

14. The OLED display device according to claim 12, wherein the signal detection circuit further comprises a power switch element and a control line;
one end of the power switch element is connected with the power supply terminal; the other end of the power switch element is connected with the first terminal of the magneto-dependent sensor; and
a control terminal of the power switch element is connected with the control line.

15. The OLED display device according to claim 14, further comprising a gate drive circuit, wherein the control line is configured to receive a control signal provided by the gate drive circuit.

16. The OLED display device according to claim 11, wherein the signal detection circuit comprises a detection voltage input sub-circuit and an induction signal output sub-circuit;
the detection voltage input sub-circuit is connected to the first pair of terminals and the second pair of terminals; and
the induction signal output sub-circuit comprises a first output terminal and a second output terminal which are connected to the first pair of terminals and the second pair of terminals and configured to respectively output a first detection voltage and a second detection voltage in different periods.

17. The OLED display device according to claim 16, wherein the detection voltage input sub-circuit comprises a first switch element, a second switch element, a third switch element and a fourth switch element;
one end of the first switch element is coupled to power supply, and the other end of the first switch element is coupled to the first terminal; a control terminal of the first switch element is configured to receive a second control signal;
one end of the second switch element is coupled to the power supply, and the other end of the second switch element is coupled to the second terminal; a control terminal of the second switch element is configured to receive a first control signal;
one end of the third switch element is coupled to a ground, and the other end of the third switch element is coupled to the third terminal; a control terminal of the third switch element is configured to receive the second control signal; and
one end of the fourth switch element is coupled to the ground, and the other end of the fourth switch element is coupled to the fourth terminal; and a control terminal of the fourth switch element is configured to receive the first control signal.

18. The OLED display device according to claim 17, wherein the induction signal output sub-circuit comprises a fifth switch element, a sixth switch element, a seventh switch element and an eighth switch element;
one end of the fifth switch element is coupled with the first terminal, and the other end of the fifth switch element is coupled with the first output terminal; a control terminal of the fifth switch element is configured to receive the first control signal;
one end of the sixth switch element is coupled with the second terminal, and the other end of the sixth switch element is coupled with the first output terminal; a control terminal of the sixth switch element is configured to receive the second control signal;
one end of the seventh switch element is coupled with the third terminal, and the other end of the seventh switch element is coupled with the second output terminal; a control terminal of the seventh switch element is configured to receive the first control signal;
one end of the eighth switch element is coupled with the fourth terminal, and the other end of the eighth switch element is coupled with the second output terminal; and a control terminal of the eighth switch element is configured to receive the second control signal.

19. The OLED display device according to claim 18, further comprising an offset voltage cancel circuit, wherein the offset voltage cancel circuit comprises a first input terminal, a second input terminal, an amplifying sub-circuit, a selection sub-circuit, a first capacitor, a second capacitor and an output sub-circuit,
the first input terminal and the second input terminal of the offset voltage cancel circuit are connected to the first output terminal and the second output terminal of the induction signal output sub-circuit and configured to respectively receive the first detection voltage and the second detection voltage;
the amplifying sub-circuit is configured to respectively amplify the first detection voltage, take the first detection voltage as a first amplifying voltage, and output the first amplifying voltage to the second capacitor, and reversely amplify the second detection voltage, take the second detection voltage as a second amplifying voltage, and output the second amplifying voltage to the first capacitor;
the selection sub-circuit is configured to store the first amplifying voltage into the second capacitor and store the second amplifying voltage into the first capacitor;
a first end of the first capacitor is connected with a first end of the second capacitor; and the output sub-circuit is configured to be capable of connecting the first capacitor and the second capacitor in parallel and outputting a voltage.

\* \* \* \* \*